United States Patent
Tanaka et al.

(10) Patent No.: US 6,750,946 B2
(45) Date of Patent: Jun. 15, 2004

(54) PROCESSING APPARATUS FOR PROCESSING SAMPLE IN PREDETERMINED ATMOSPHERE

(75) Inventors: Yutaka Tanaka, Tochigi (JP); Shigeru Terashima, Tochigi (JP); Shinichi Hara, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 09/897,930

(22) Filed: Jul. 5, 2001

(65) Prior Publication Data

US 2002/0002946 A1 Jan. 10, 2002

(30) Foreign Application Priority Data

Jul. 6, 2000 (JP) ........................................ 2000-204491

(51) Int. Cl.[7] .......................... G03B 27/52; G03B 27/42
(52) U.S. Cl. .......................................... 355/30; 355/53
(58) Field of Search ............................ 355/30, 27, 53, 355/72–76; 118/719; 219/390

(56) References Cited

U.S. PATENT DOCUMENTS

| 5,093,579 | A | | 3/1992 | Amemiya et al. | ........ 250/453.1 |
| 5,172,403 | A | | 12/1992 | Tanaka et al. | .................. 37/34 |
| 5,524,131 | A | | 6/1996 | Uzawa et al. | ............. 250/453.1 |
| 5,578,129 | A | * | 11/1996 | Moriya | ........................ 118/719 |
| 5,828,572 | A | * | 10/1998 | Hasegawa et al. | ..... 364/468.24 |
| 5,871,587 | A | * | 2/1999 | Hasegawa et al. | ........... 118/719 |
| 6,133,981 | A | * | 10/2000 | Semba | ......................... 355/27 |

FOREIGN PATENT DOCUMENTS

JP      2-100311      4/1990

* cited by examiner

*Primary Examiner*—Henry Hung Nguyen
(74) *Attorney, Agent, or Firm*—Fitzpatrick, Cella, Harper & Scinto

(57) ABSTRACT

A substrate processing system has a first processing device which processes a substrate with a first process in a first gas atmosphere within a process chamber and a transfer device that transfers a substrate in a second gas atmosphere within a clean booth, the transfer device transferring a substrate which has been processed with a second process by a second processing device or a substrate which is to be processed by that second processing device. A load-lock chamber has a substrate transfer path between the first processing device and the transfer device and there is a gas supply device which supplies the first gas from the process chamber to the load-lock chamber when the substrate is transferred between the load-lock chamber and a first processing device, and supplies the second gas from the clean booth to the load-lock chamber when the substrate is transferred between the load-lock chamber and the transfer device.

14 Claims, 7 Drawing Sheets

PROCESSING APPARATUS FOR PROCESSING SAMPLE IN PREDETERMINED ATMOSPHERE

FIELD OF THE INVENTION

The present invention relates to a sample processing apparatus and method and device manufacturing method and, more particularly, to a sample processing apparatus and method and device manufacturing method, which process a sample such as a wafer in a predetermined atmosphere such as a reduced-pressure atmosphere of a specific gas and are suitable for an X-ray exposure apparatus, an F2 exposure apparatus, a CVD apparatus, and the like.

BACKGROUND OF THE INVENTION

As an example of a processing apparatus for processing a substrate in a predetermined atmosphere such as a reduced-pressure atmosphere, an X-ray exposure apparatus for transferring a pattern formed on a mask onto a wafer in reduced-pressure helium atmosphere is known (Japanese Patent-Laid Open No. 2-100311).

FIG. 7 is a view showing a conventional semiconductor manufacturing apparatus. This apparatus uses, as exposure light, SR light, i.e., synchrotron radiation (synchrotron radiation) as soft X-rays and comprises an SR light source 101 for generating the SR light, a beam line 102, and a hermetic process chamber 103. The beam line 102 having an ultra-high vacuum atmosphere is connected to the SR light source 101 through a gate valve 102a to guide SR light to the process chamber 103.

A mask $M_0$ with a transfer pattern formed on a thin membrane and a wafer $W_0$ are placed in the process chamber 103. The mask $M_0$ and wafer $W_0$ are placed on alignment stages (not shown), respectively. At the time of exposure in which the pattern formed on the mask $M_0$ is transferred onto the wafer $W_0$, a helium atmosphere at a reduced pressure of, e.g., 150 Torr is set in the process chamber 103 to suppress any attenuation of the SR light as exposure light.

The process chamber 103 has an X-ray window 104 which is normally made of beryllium. The X-ray window 104 serves as a partition for separating the helium atmosphere in the process chamber 103 from the ultra-high vacuum atmosphere in the beam line 102.

In such a processing apparatus, if the entire process chamber 103 is opened to outer air every time the mask $M_0$ or wafer $W_0$ is loaded to or unloaded from the process chamber 103, a considerably long time is required to open the process chamber to outer air and set the predetermined atmosphere. This reduces the throughput. To avoid this problem, a small load-lock chamber 105 is arranged next to the process chamber 103 such that the mask $M_0$ or wafer $W_0$ is loaded/unloaded to/from the process chamber 103 through the load-lock chamber 105. The load-lock chamber 105 has a gate valve 106 on the process chamber side and a gate valve 107 on the outer air side.

The apparatus also has a coater/developer 108 for applying a resist onto the wafer and developing the wafer after exposure, and a transfer mechanism 109 inserted between the load-lock chamber 105 and the coater/developer 108 to transfer the wafer.

The procedure of loading the wafer $W_0$ to the process chamber 103 will be described below.

(STEP 1) The gate valve 107 on the outer air side is opened, and the wafer is fed to the load-lock chamber 105 by the transfer mechanism 109. At this time, the gate valve 106 on the process chamber 103 side is kept closed.

(STEP 2) The gate valve 107 on the outer air side is closed, and a reduced-pressure helium atmosphere is set in the load-lock chamber 105.

(STEP 3) The gate valve 106 on the process chamber 103 side is opened, and the wafer $W_0$ is transferred into the process chamber 103 by a transfer mechanism (not shown) in the process chamber 103.

For unloading, the procedures are reversed.

In the conventional semiconductor manufacturing process, the whole manufacturing apparatus is installed in a clean room of a factory, thereby taking a measure against contamination by dust or the like. However, for micropatterning of 0.2- to 0.1-$\mu$m level coping with recent semiconductor integration, the required cleanliness becomes strict from class 10 to class 1. To achieve this cleanliness in the entire clean room, the clean room building/maintenance cost becomes incredibly high. In addition, maintenance of one apparatus decreases the cleanliness in the entire clean room, resulting in adverse effect on other apparatuses.

As described above, the processing apparatus requires a load-lock chamber to improve the throughput. Since the load-lock chamber atmosphere changes from outer air to the same atmosphere as in the process chamber 103 and vice versa, the cleanliness must be managed depending on the atmosphere.

SUMMARY OF THE INVENTION

The present invention has been made in consideration of the above conventional problems, which are kept unsolved, and has as its object to provide a processing apparatus and method and a device manufacturing method which can inexpensively manage the cleanliness throughout the transfer path for a sample such as a substrate and effectively avoid contamination of the sample.

It is the second object of the present invention to manage the cleanliness throughout the sample transfer path and efficiently manage the cleanliness in the load-lock chamber at the time of loading/unloading a sample.

It is the third object of the present invention to manage the cleanliness throughout the sample transfer path and easily manage the cleanliness in the load-lock chamber depending on the atmosphere.

It is the fourth object of the present invention to manage the cleanliness throughout the sample transfer path and manage the cleanliness in the load-lock chamber depending on the atmosphere while suppressing moisture mixing.

The first aspect of the present invention is related to a processing apparatus for processing a sample. The processing apparatus comprises a process chamber for processing the sample in a predetermined atmosphere, a load-lock chamber connected to the process chamber, a transfer mechanism for transferring the sample between the load-lock chamber and another unit or container, a clean booth which covers a transfer path of the transfer mechanism, and a transfer atmosphere forming mechanism for flowing a clean gas in the clean booth.

According to a preferred embodiment of the present invention, the transfer atmosphere forming mechanism preferably comprises, e.g., a supply source of the gas, and a filter inserted between the supply source of the gas and the transfer path, and more preferably, further comprises a straightening plate for passing the gas from the filter, which has passed through the transfer path.

According to a preferred embodiment of the present invention, the processing apparatus preferably further comprises, in the load-lock chamber, a gas control mechanism for supplying a clean gas which is the same as in the process chamber or as in the clean booth into the load-lock chamber or exhausting the gas from the load-lock chamber. To supply the gas which is the same as in the process chamber to the load-lock chamber, the gas control mechanism supplies, e.g., the clean gas in the process chamber to the load-lock chamber, and to supply the gas which is the same as in the clean booth to the load-lock chamber, the gas control mechanism supplies, e.g., the clean gas in the clean booth to the load-lock chamber. More preferably, gates are arranged between the load-lock chamber and the process chamber and between the load-lock chamber and the clean booth, in transferring the sample from the load-lock chamber to the process chamber, the gas control mechanism supplies the same clean gas as in the process chamber to the load-lock chamber before the gate between the load-lock chamber and the process chamber is opened, and in transferring the sample from the load-lock chamber to the clean booth, the gas control mechanism supplies the same clean gas as in the clean booth to the load-lock chamber before the gate between the load-lock chamber and the clean booth is opened.

According to a preferred embodiment of the present invention, the processing apparatus preferably further comprises, in the load-lock chamber, a gas control mechanism for supplying a clean gas which is the same as in the process chamber or a clean dry gas into the load-lock chamber or exhausting the gas from the load-lock chamber. More preferably, gates are arranged between the load-lock chamber and the process chamber and between the load-lock chamber and the clean booth, in transferring the sample from the load-lock chamber to the process chamber, the gas control mechanism supplies the same clean gas as in the process chamber to the load-lock chamber before the gate between the load-lock chamber and the process chamber is opened, and in transferring the sample from the load-lock chamber to the clean booth, the gas control mechanism supplies the clean dry gas to the load-lock chamber before the gate between the load-lock chamber and the clean booth is opened.

According to a preferred embodiment of the present invention, the transfer atmosphere forming mechanism forms a laminar flow of the clean gas in the clean booth.

According to a preferred embodiment of the present invention, preferably, the processing apparatus further comprises an exposure apparatus in the process chamber, and another unit comprises a coater/developer.

Another aspect of the present invention is related to a method of processing a sample, comprising the steps of transferring the sample to a load-lock chamber by a transfer mechanism installed in a clean booth in which a clean gas flows, adjusting a pressure in the load-lock chamber and transferring the sample from the load-lock chamber into a process chamber, processing the sample in the process chamber, transferring the sample from the process chamber to the load-lock chamber, and adjusting the pressure in the load-lock chamber, extracting the sample from the load-lock chamber, and transferring the sample by the transfer mechanism installed in the clean booth in which the clean gas flows.

According to still another aspect, the present invention is related to a method of manufacturing a device, comprising the steps of transferring a substrate coated with a photosensitive agent to a load-lock chamber by a transfer mechanism installed in a clean booth in which a clean gas flows, adjusting a pressure in the load-lock chamber and transferring the substrate from the load-jock chamber into a process chamber, transferring a pattern onto the substrate by an exposure apparatus installed in the process chamber, transferring the substrate from the process chamber to the load-lock chamber, adjusting the pressure in the load-lock chamber, extracting the substrate from the load-lock chamber, and transferring the substrate by the transfer mechanism installed in the clean booth in which the clean gas flows.

The preferred embodiment of the present invention solves a problem that if the transfer mechanism for transferring the substrate to be processed from the coater/developer for executing pre-process and post-process of the substrate to be processed to the load-lock chamber is exposed to air in the clean room, the cleanliness in the entire clean room must be increased to maintain the cleanliness of the atmosphere in the process chamber and load-lock chamber, resulting in an increase in cost. According to the preferred embodiment of the present invention, the entire transfer path by the transfer mechanism is arranged in the clean booth, and a laminar flow of a clean gas is formed in the clean booth, thereby preventing dust from sticking to the substrate to be processed.

According to a preferred embodiment of the present invention, the substrate such as a wafer to be processed can be kept in the clean state during transfer only by managing the compact clean booth without increasing the cleanliness in the entire clean room. For this reason, as compared to the case wherein the entire clean room is strictly managed, the cost can be reduced, and the maintenance does not adversely affect other apparatuses.

Providing a load-lock chamber gas fluidizing mechanism (gas control mechanism) for generating a laminar flow of a clean gas in the load-lock chamber in accordance with the preferred embodiment of the present invention is very effective in keeping the substrate to be processed in the load-lock chamber clean.

When the gas control mechanism for selectively supplying the ambient gas in the process chamber or air in the clean booth to the load-lock chamber is arranged in accordance with the preferred embodiment of the present invention so as to circulate the gas, the cost can be further reduced.

When the gas control mechanism for selectively supplying the ambient gas in the process chamber or dry gas to the load-lock chamber is arranged in accordance with the preferred embodiment of the present invention, moisture can be prevented from entering the load-lock chamber to prevent contamination of the substrate to be processed, or the vacuum suction time can be shortened.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The embodiments of the present invention will be described with reference to the accompanying drawings.

Figure 1:
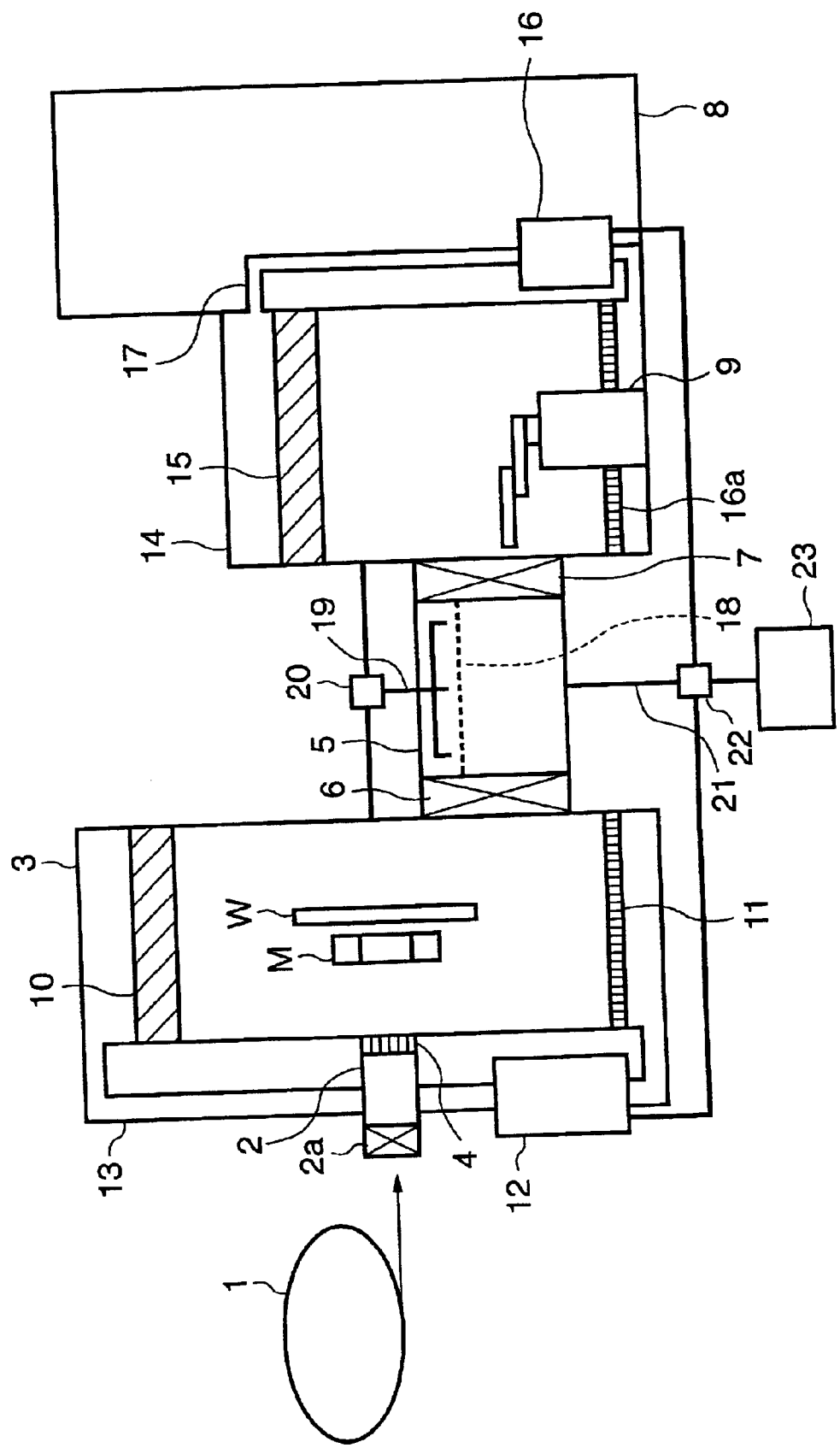
FIG. 1 is a schematic view showing the first embodiment.

FIG. 1 is a view showing a processing apparatus according to the first embodiment of the present invention. This processing apparatus is a semiconductor manufacturing apparatus including an X-ray exposure apparatus of a so-called in-line system, which has an exposure system using SR light, i.e., soft X-rays as exposure light and continuously processes wafers as substances to be processed. The apparatus has an SR light source 1 for generating SR light, a beam line 2, and a hermetic process chamber 3.

The beam line 2 has an ultra-high vacuum atmosphere and is connected to the SR light source 1 through a gate valve 2a. The SR light from the SR light source 1 is guided to the process chamber 3 through the beam line 2. A mask M with a transfer pattern formed on a thin membrane and a wafer W are placed in the process chamber 3. The mask M and the wafer W are placed on alignment stages (not shown), respectively. At the time of exposure in which the pattern formed on the mask M is transferred onto the wafer W, a reduced-pressure helium atmosphere at a reduced pressure of, e.g., 150 Torr is set in the process chamber 3 to suppress any attenuation of the SR light as an exposure light. The process chamber 3 has an X-ray window 4, which is generally made of beryllium. The X-ray window 4 serves as a partition for separating the helium atmosphere in the process chamber 3 from the ultra-high vacuum atmosphere in the beam line 2.

In such a processing apparatus for processing a wafer in a predetermined atmosphere, if the entire process chamber 3 is opened to outer air or clean room atmosphere every time the mask M or wafer W is loaded to or unloaded from the process chamber 3, a considerably long time is required to open the process chamber to outer air and set the above-described reduced-pressure atmosphere as the predetermined atmosphere. This reduces the throughput. To avoid this problem, a small load-lock chamber 5 is arranged next to the process chamber 3 such that the mask M or wafer W is loaded/unloaded to/from the process chamber 3 through the load-lock chamber 5. The load-lock chamber 5 has a gate valve 6 on the process chamber side and a gate valve 7 on the outer air side (on the clean booth (to be described later) side).

The apparatus also has a coater/developer 8 for applying a resist onto the wafer before exposure and developing the wafer after exposure, and a transfer mechanism 9 inserted between the load-lock chamber 5 and the coater/developer 8 to transfer the wafer.

A filter 10 for removing particles and chemical components is provided on the upper side of the process chamber 3. A straightening plate 11 is arranged on the entire lower surface. Helium as the ambient gas in the process chamber 3 is exhausted by a helium circulation unit 12 and returned to the upper side of the filter 10 in the process chamber 3 through a helium circulation duct 13. With this arrangement, a laminar flow of clean helium is formed in the process chamber 3.

On the outer air side of the load-lock chamber 5, a clean booth 14 is provided, which has one surface connected to the gate valve 7 and the other surface connected to the coater/developer 8 and covers the whole wafer transfer path by the transfer mechanism 9. The clean booth 14 has a clean booth gas fluidizing mechanism or transfer atmosphere forming mechanism which comprises a filter 15 arranged above the full range of the transfer path by the transfer mechanism 9, an air circulation unit 16, an air circulation duct 17, and a straightening plate 16a arranged below the full range of the transfer path by the transfer mechanism 9. The air in the clean booth 14 is exhausted by the air circulation unit 16 and returned above the filter 15 in the clean booth 14 through the air circulation duct 17. With this arrangement, a laminar flow of clean air with high cleanliness is formed in the full range of the wafer transfer path.

A straightening plate 18 is arranged under the entire upper surface of the load-lock chamber 5. A supply pipe 19 that opens to the upper side of the straightening plate 18 has one end connected to the load-lock chamber 5 and the other side connected to the process chamber 3 and clean booth 14 through a supply switching valve 20 serving as a selection mechanism or gas control mechanism, thereby constructing a load-lock chamber gas fluidizing mechanism. By the supply switching valve 20, one of three states can be selected: (1) a state wherein no gas is supplied into the load-lock chamber 5, (2) a state wherein helium is supplied into the load-lock chamber 5 through the supply pipe 19 (state wherein the valve is opened to the "process chamber 3 side"), or (3) a state wherein air is supplied into the load-lock chamber 5 through the supply pipe 19 (state wherein the valve is opened to the "clean booth 14 side").

One end of an exhaust pipe 21 is connected to the load-lock chamber 5, and the other end is connected to an exhaust unit 23, helium circulation unit 12, and air circulation unit 16 through an exhaust switching valve 22. By the exhaust switching valve 22, one of three states can be selected: (1) a state wherein the gas is exhausted from the load-lock chamber 5 through the exhaust pipe 21 by the exhaust mechanism 23 ("exhaust"), (2) air is circulated through the load-lock chamber 5 ("air circulation"), or (3) a state wherein helium is circulated through the load-lock chamber 5 ("helium circulation"). The straightening plate 18 is formed from, e.g., a punching metal with a number of perforations formed in a metal plate so as to form, the load-lock chamber 5, a uniform flow (laminar flow) of a gas supplied through the supply pipe 19.

The procedure of loading the wafer W to the process chamber 3 will be described below.

Figure 2A:
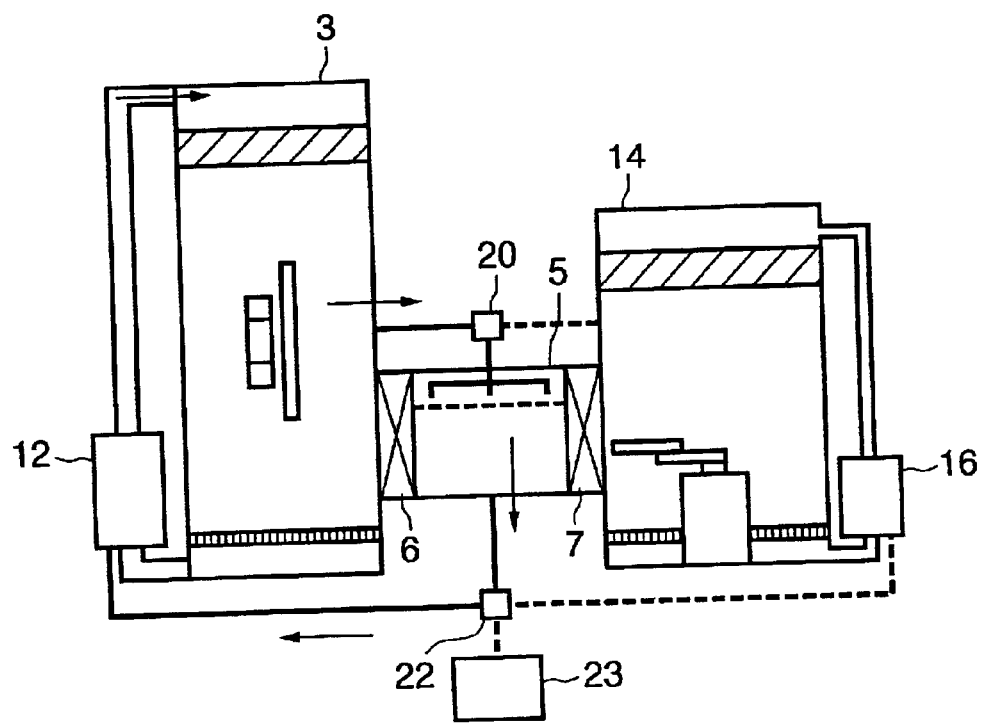
FIGS. 2A and 2B are views for explaining pipe switching in the apparatus shown in FIG. 1.
Figure 2B:
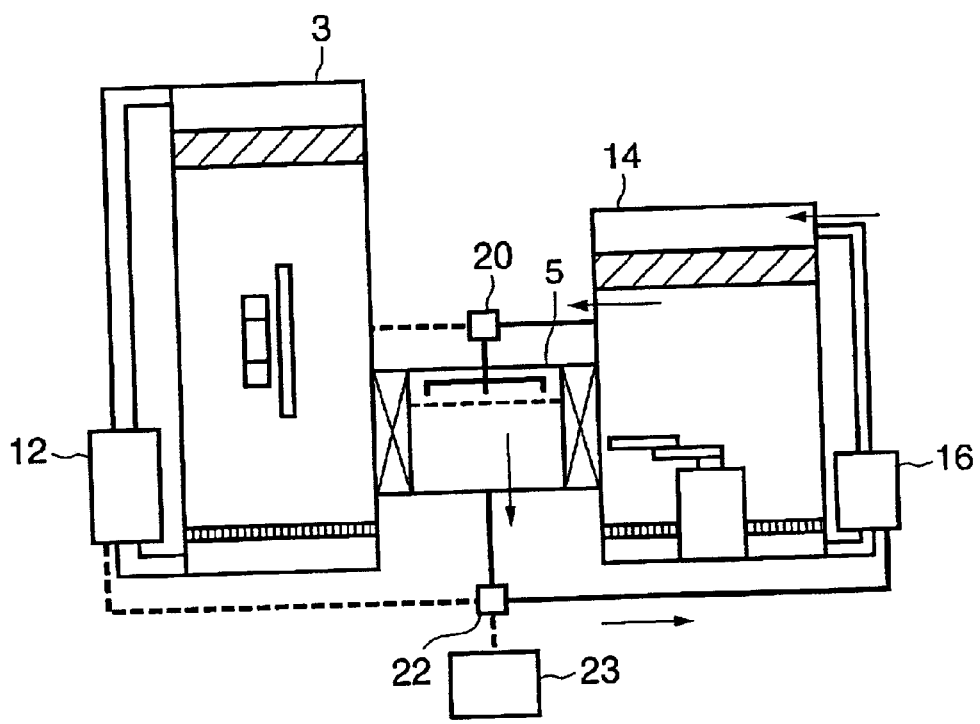

(STEP 0) First, the process chamber 3 is exhausted to a vacuum (e.g., 0.1 Torr) by an exhaust mechanism (not shown), and helium is supplied to, e.g., 150 Torr by a helium supply mechanism (not shown). After that, the helium circulation unit 12 is driven to form a laminar flow of helium in the process chamber 3. At this time, the gate valve 6 on the process chamber 3 is kept closed, and the gate valve 7 on the outer air side (clean booth 14 side) is kept open. The supply switching valve 20 is switched to the clean booth 14 side, and the exhaust switching valve 22 is switched to air circulation, thereby forming a laminar flow of clean air in the load-lock chamber 5 (FIG. 2B).

(STEP 1) A wafer coated with a resist by the coater/developer 8 is fed into the load-lock chamber 5 by the transfer mechanism 9 in the clean booth 14. Since the laminar flow of clean air is formed in the clean booth 14 and load-lock chamber 5, i.e., throughout the transfer path, the wafer can be transferred while keeping a very high cleanliness.

(STEP 2) The gate valve 7 and supply switching valve 20 are closed, the exhaust switching valve 22 is switched to exhaust by the exhaust mechanism 23, and the load-lock chamber 5 is exhausted to 0.1 Torr. After that, the exhaust switching valve 22 is switched to helium circulation.

(STEP 3) The supply switching valve 20 is switched to the process chamber 3 side. At this time, a decrease in pressure in the process chamber 3 can be compensated for with helium by the helium supply mechanism (not shown), as needed. In this state, a laminar flow of helium is formed in the load-lock chamber 5, as in the process chamber 3 (FIG. 2A).

(STEP 4) When the pressure in the load-lock chamber 5 equals that in the process chamber 3, the gate valve 6 on the process chamber 3 side is opened, and the wafer is transferred into the process chamber 3 by the transfer mechanism (not shown) in the process chamber 3.

In this state, exposure processing is executed to transfer the pattern formed on the mask M onto the wafer W.

The procedure of unloading the wafer after exposure processing will be described next.

(STEP 5) The wafer that has undergone the exposure processing is transferred into the load-lock chamber 5 by the transfer mechanism (not shown) in the process chamber 3.

(STEP 6) The gate valve 6 on the process chamber 3 side is closed, the exhaust switching valve 22 is switched to air circulation, and the supply switching valve 20 is switched to the clean booth side. After that, air is fed into the load-lock chamber 5 to restore the atmospheric pressure. In this state, a laminar flow of air is formed in the load-lock chamber 5 (FIG. 2B).

(STEP 7) When the pressure in the load-lock chamber 5 equals that in the clean booth 14, the gate valve 7 on the outer air side is opened, and the wafer is transferred to the coater/developer 8 by the transfer mechanism 9.

Figure 3:
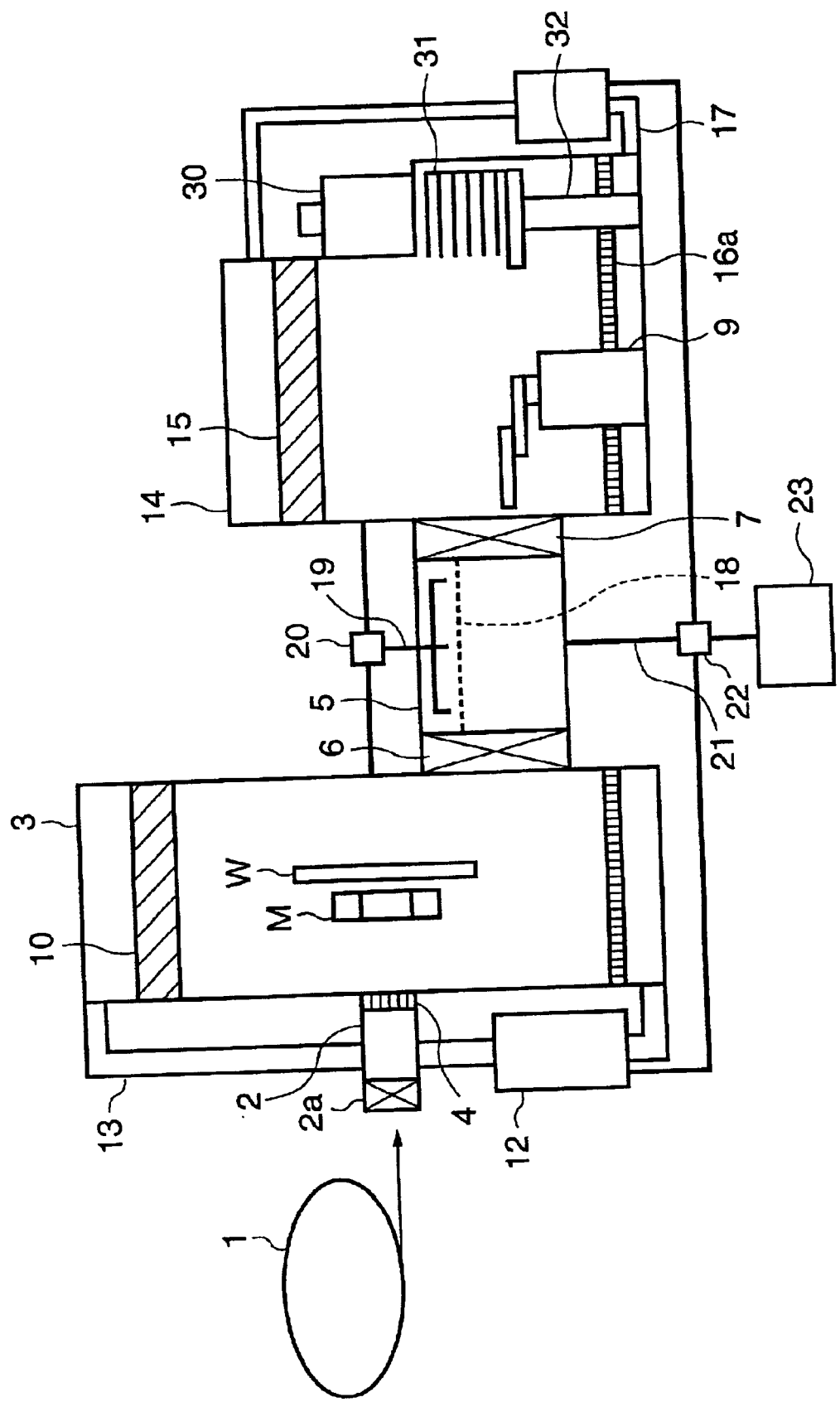
FIG. 3 is a schematic view showing a modification to the first embodiment.

FIG. 3 is a view showing a modification to the first embodiment. In this modification, a wafer is loaded/unloaded to/from the reduced-pressure processing apparatus using a transfer container 30 which stores a wafer carrier 31 and is filled with clean air. The clean booth 14 has an elevating mechanism 32 for loading/unloading the wafer carrier 31 to/from the clean booth 14.

Figure 4:
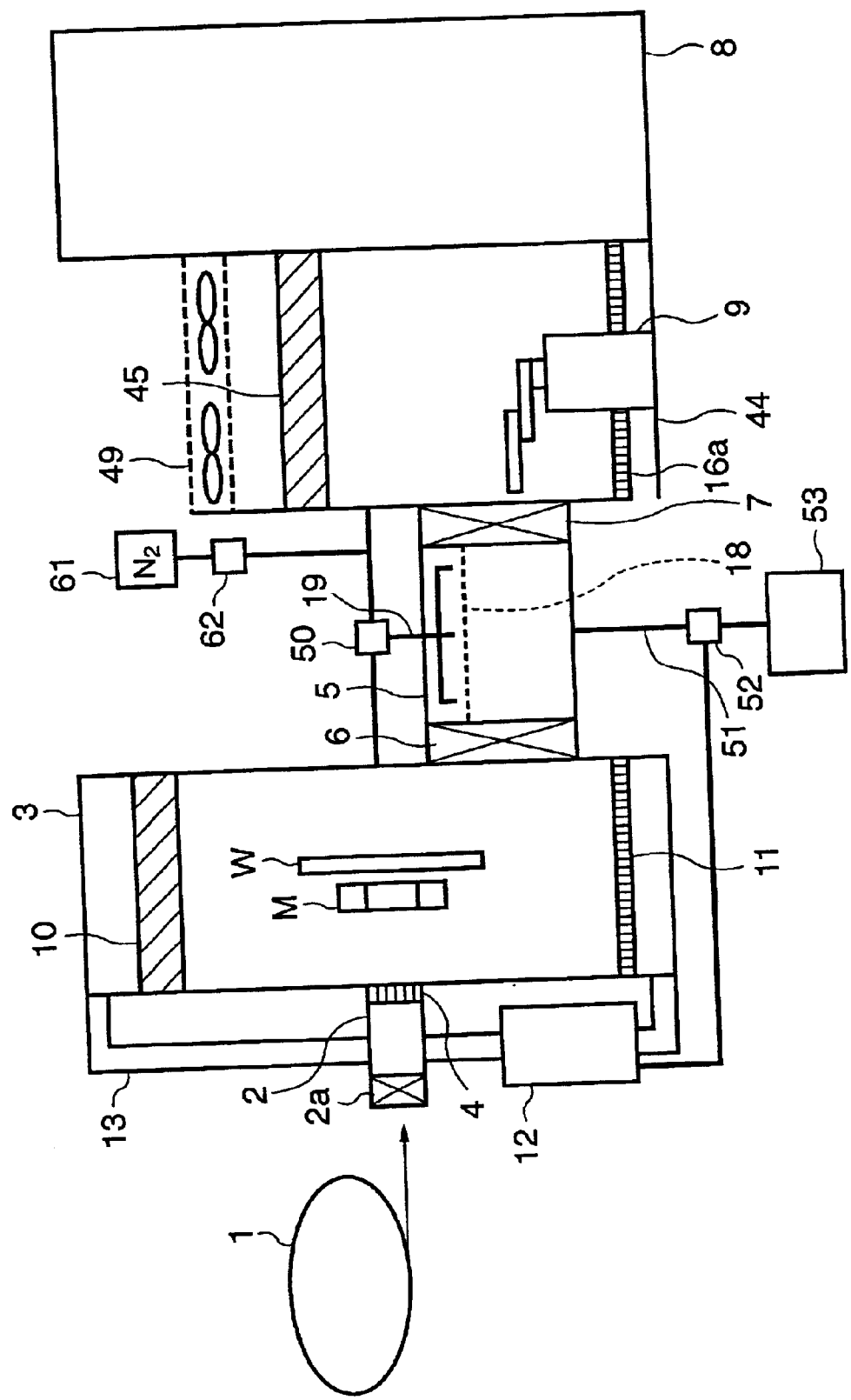
FIG. 4 is a schematic view showing the second embodiment.

FIG. 4 is a view showing the second embodiment of the present invention. In this case, a load-lock chamber 5 is opened to outer air using dry nitrogen as a dry gas. A clean booth 44 has one surface connected to a gate valve 7 of the load-lock chamber 5 on the outer air side and the other surface connected to a coater/developer 8 and covers the wafer transfer path. A filter 45 is provided under the entire upper surface of the clean booth 44. The clean booth 44 is open, and a fan unit 49 is arranged on the upper side of the clean booth 44. Air is supplied from the upper side to the clean booth 44 by the fan unit 49 through the filter 45 and exhausted outside from the lower side of the clean booth 44. With this arrangement, a laminar flow of clean air with high cleanliness is formed in the full range of the wafer transfer path.

A supply pipe 19 has one end connected to the load-lock chamber 5 and the other end connected to a process chamber 3 and dry nitrogen supply source 61 through a supply switching valve 50. By the supply switching valve 50, one of three states can be selected: (1) a stage wherein no gas is supplied into the load-lock chamber, (2) a state wherein helium is supplied into the load-lock chamber 5 through the supply pipe 19 (state wherein the valve is opened to the "process chamber side"), or (3) a state wherein dry nitrogen is supplied into the load-lock chamber 5 through the supply pipe 19 (state wherein the valve is opened to the "nitrogen side"). In addition, by a flow rate adjusting valve 62, the flow rate of nitrogen can be adjusted such that a predetermined pressure is set in the load-lock chamber 5.

One end of an exhaust pipe 51 is connected to the load-lock chamber 5, and the other end is connected to an exhaust mechanism 53 and helium circulation unit 12 through an exhaust switching valve 52. By the exhaust switching valve 52, one of two states can be selected: (1) a state wherein the gas is exhausted from the load-lock chamber 5 through the exhaust pipe 51 by the exhaust mechanism 53 ("exhaust"), or (2) a state wherein helium is circulated through the load-lock chamber 5 ("helium circulation").

The process chamber 3, X-ray window 4, load-lock chamber 5, gate valves 6 and 7, coater/developer 8, and transfer mechanism 9 denoted by the same reference numerals as in the first embodiment have the same arrangements as in the first embodiment, and a detailed description thereof will be omitted.

(STEP 0) First, a laminar flow of helium is formed in the process chamber 3 in accordance with the same procedures as in the first embodiment. At this time, the gate valve 6 on the process chamber 3 side is kept closed, and the gate valve 7 on the outer air side (clean booth 44 side) is kept open. The supply switching valve 50 is switched to the nitrogen side, and the exhaust switching valve 52 is switched to the exhaust mechanism 53 side, thereby forming a laminar flow of clean dry nitrogen in the load-lock chamber 5.

(STEP 1) A wafer coated with a resist by the coater/developer 8 is sent into the load-lock chamber 5 by the transfer mechanism 9.

(STEP 2) The gate valve 7 on the outer air side (clean booth 44 side) and the supply switching valve 50 are closed and the load-lock chamber 5 is exhausted to 0.1 Torr. After that, the exhaust switching valve 52 is switched to helium circulation.

(STEP 3) The supply switching valve 50 is switched to the process chamber side. At this time, a decrease in pressure in the process chamber 3 can be compensated for with helium by the helium supply mechanism (not shown), as needed. In this state, a laminar flow of helium is formed in the load-lock chamber 5, as in the process chamber 3.

(STEP 4) When the pressure in the load-lock chamber 5 equals that in the process chamber 3, the gate valve 6 on the process chamber 3 side is opened, and the wafer is transferred into the process chamber 3 by the transfer mechanism (not shown) in the process chamber 3.

In this state, exposure processing is executed to transfer a pattern formed on a mask M onto a wafer W.

The procedure of unloading the wafer after exposure processing will be described next.

(STEP 5) The wafer that has undergone the exposure processing is transferred into the load-lock chamber 5 by the transfer mechanism (not shown) in the process chamber 3.

(STEP 6) The gate valve 6 on the process chamber side is closed, the supply switching valve 50 is switched to the nitrogen side, and the exhaust switching valve 52 is switched to the exhaust mechanism 53 side. Nitrogen is supplied while adjusting the flow rate by the flow rate adjusting valve 62 until the atmospheric pressure is restored in the load-lock chamber 5.

(STEP 7) When the pressure in the load-lock chamber 5 equals that in the clean booth 44, the gate valve 7 on the outer air side (clean booth 44 side) is opened, and the wafer is transferred to the coater/developer 8 by the transfer mechanism 9.

In the first and second embodiments, a reduced-pressure processing apparatus suitable for an X-ray exposure apparatus has been described. The arrangement can also be applied to any other processing apparatus for processing a sample in a predetermined atmosphere.

In the first and second embodiments, the clean booth and load-lock chamber are connected through a gate valve. However, the load-lock chamber may be connected to the clean booth by partially inserting the load-lock chamber into the clean booth.

In the first and second embodiments, a filter capable of removing particles and chemical components is used. However, a filter capable of removing either particles or chemical components may be used. In the first and second embodiments, a straightening plate is used. However, only the filter may be used.

In the first and second embodiments, the load-lock chamber is opened to outer air using air or nitrogen. However, any other gas may be used depending on the situation.

In the first and second embodiments, one load-lock chamber is prepared in correspondence with one process chamber. However, two or more load-lock chambers may be provided for one process chamber. In this case, each load-lock chamber preferably has a clean booth that covers a transfer mechanism for transferring/receiving a sample such as a substrate to/from the load-lock chamber.

In the first and second embodiments, one clean booth is prepared in correspondence with one load-lock chamber. However, two or more clean booths each of which covers a transfer mechanism for transferring/receiving a sample such as a substrate to/from the load-lock chamber may be provided for one load-lock chamber. In this case, a sample such as a substrate may be transferred to the load-lock chamber by the transfer mechanism in the first clean booth, and the sample such as a substrate in the load-lock chamber may be received by the transfer mechanism in the second clean booth.

According to the first and second embodiments, a laminar flow of a clean gas is formed in the reduced-pressure process chamber, and a clean booth connected to a load-lock chamber is installed on the transfer path in outer air. Hence, the cleanliness in the entire factory clean room need not be strictly managed, and the cost can be largely reduced. In addition, the maintenance does not adversely affect other apparatuses.

When a circulation unit and filter are provided in the process chamber, and the gas in the process chamber is circulated to form a laminar flow, ambient gas consumption can be reduced, and the cost reduction can be promoted.

When the ambient gas in the process chamber or the gas in the clean booth is selectively supplied depending on the state of the load-lock chamber, the cleanliness can be improved by a simple mechanism without independently preparing a cylinder (bomb) or filter.

When the ambient gas in the process chamber or dry nitrogen is selectively supplied depending on the state of the load-lock chamber, moisture mixing into the load-lock chamber can be suppressed, contamination of the substrate to be processed can be prevented, and the vacuum suction time can be shortened.

Figure 5:
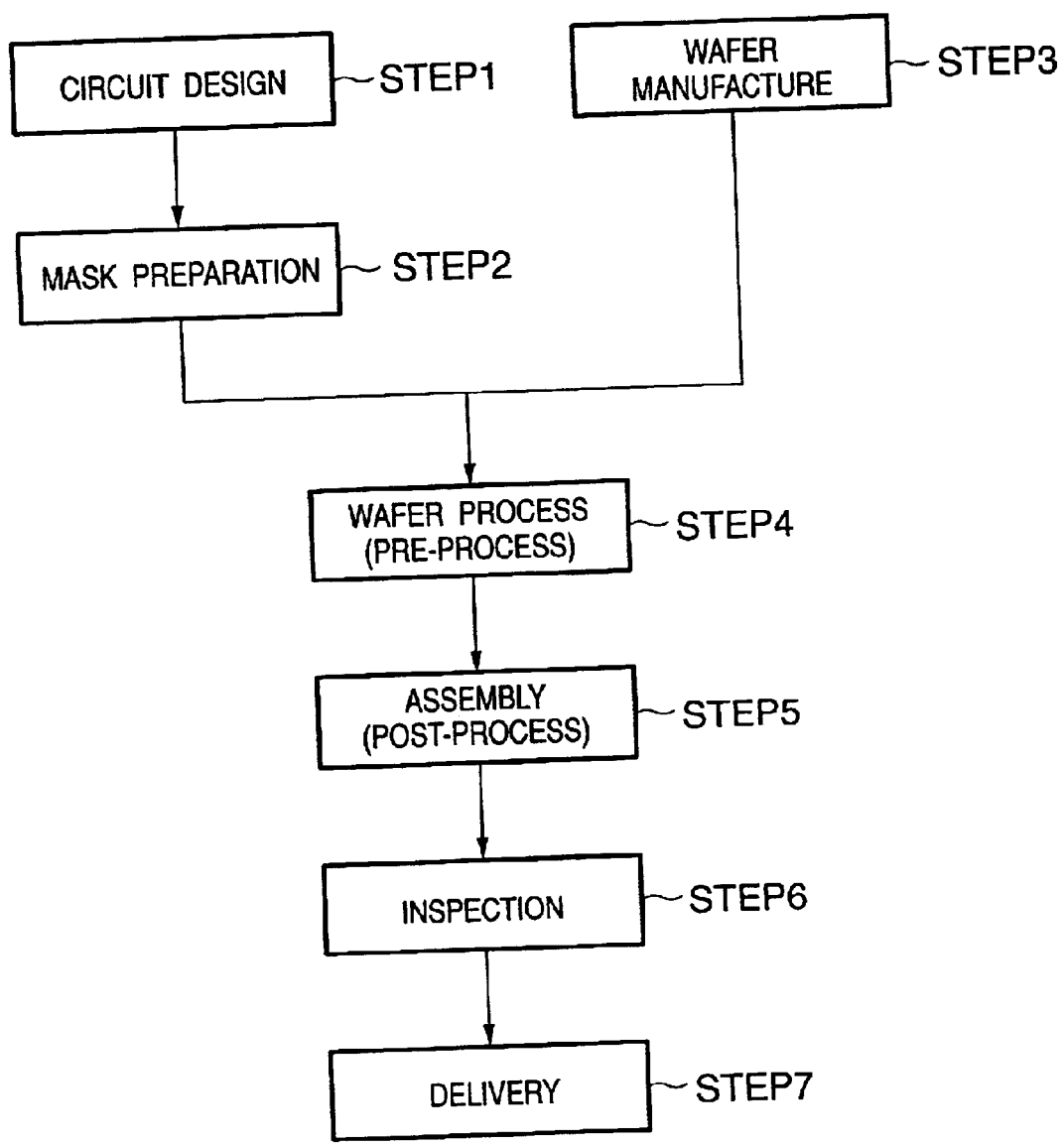
FIG. 5 is a flow chart showing a semiconductor manufacturing process.

An embodiment of a device manufacturing method will be described next. FIG. 5 shows the flow of manufacturing a semiconductor device (e.g., a semiconductor chip such as an IC or an LSI, a liquid crystal panel, or a CCD). In step 1 (circuit design), the pattern of a semiconductor device is designed. In step 2 (mask preparation), a mask (reticle) as a master having the designed pattern is prepared. In step 3 (wafer manufacture), a wafer as a substrate is manufactured using a material such as silicon. In step 4 (wafer process) called a pre-process, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and shipped (step 7).

Figure 6:
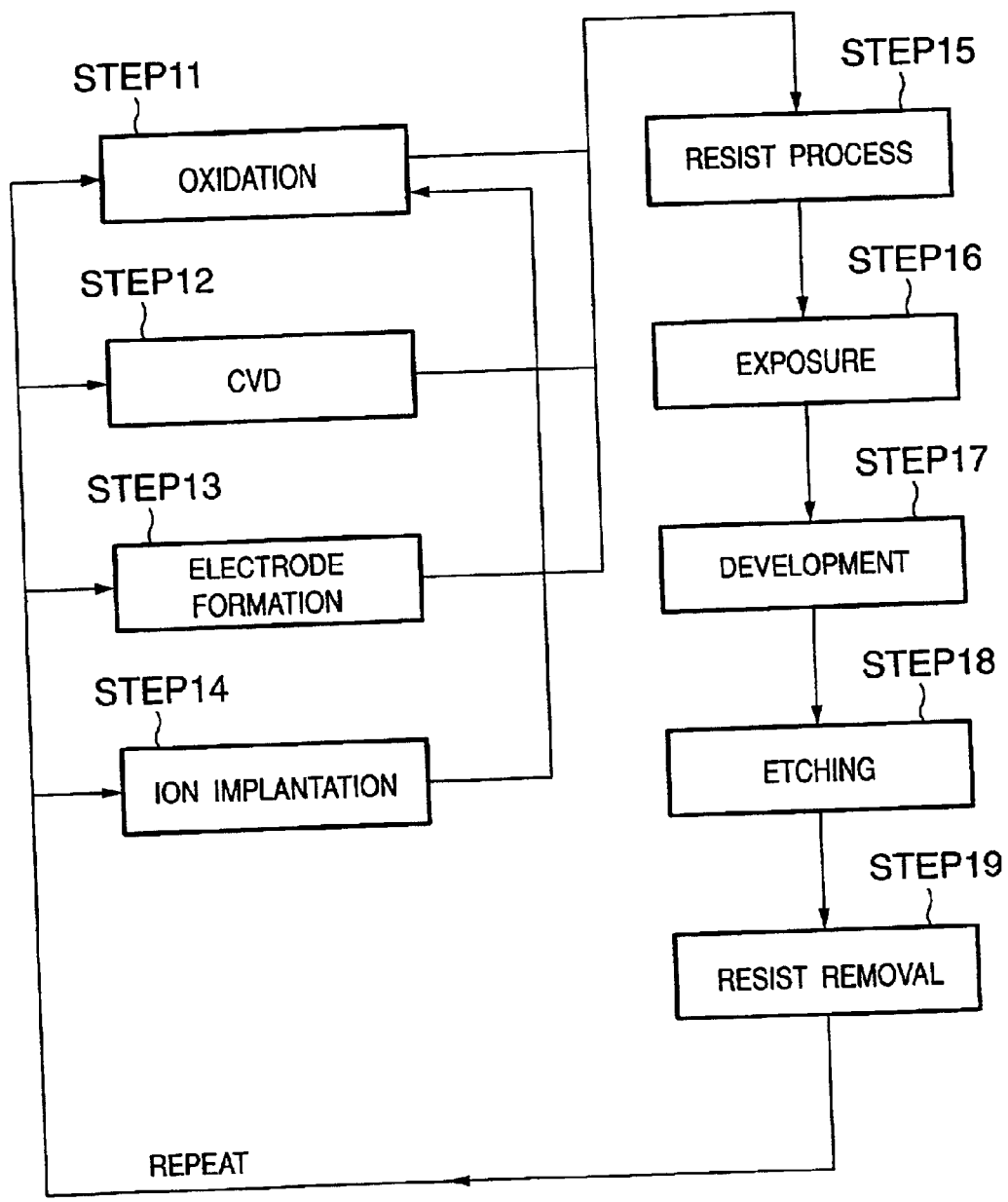
FIG. 6 is a flow chart showing a wafer process.
Figure 7:
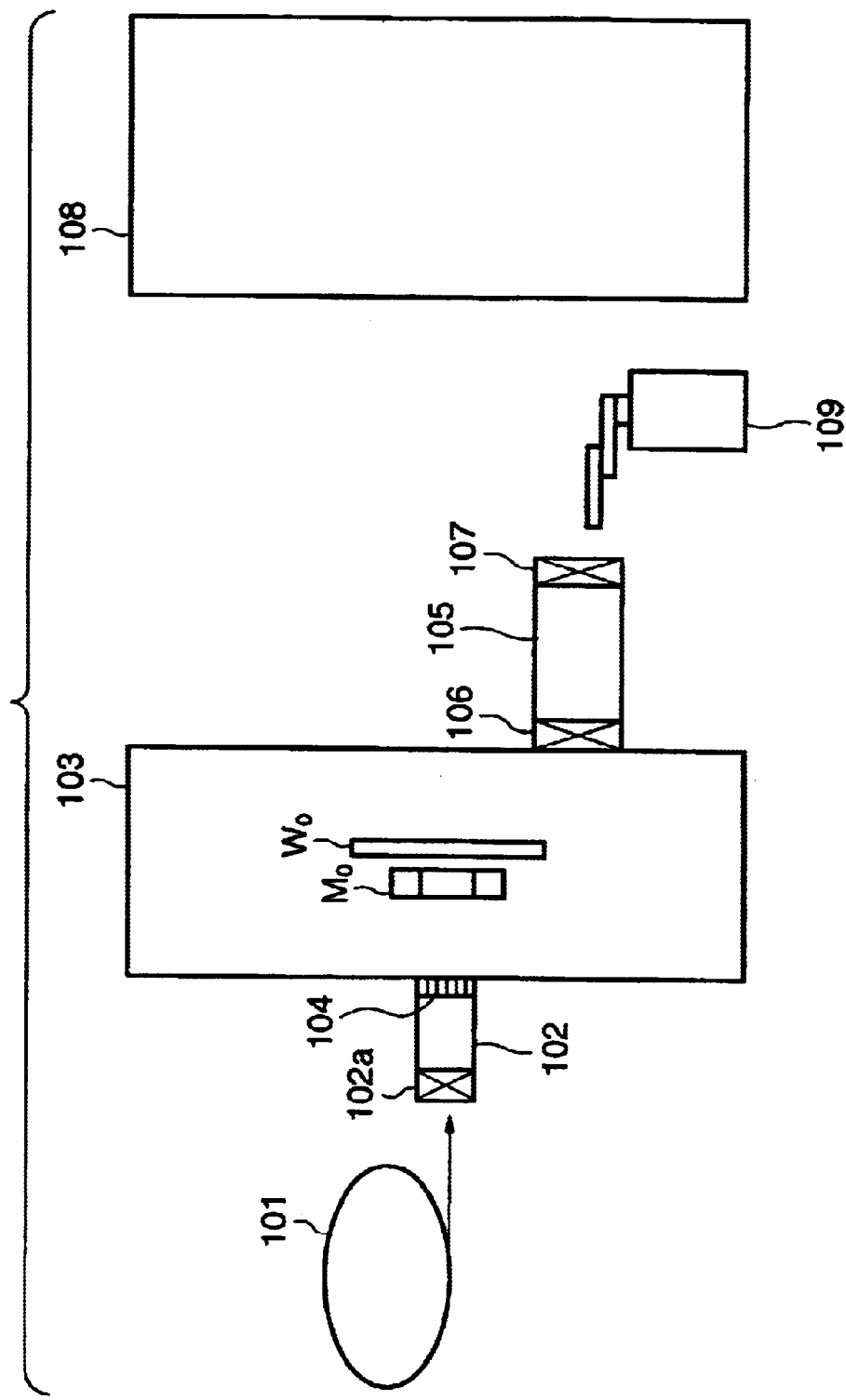
FIG. 7 is a schematic view showing a prior art arrangement.

FIG. 6 is a flow chart showing the detailed flow of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the circuit pattern of the mask is printed on the wafer by exposure using the above X-ray exposure apparatus. In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer. When the manufacturing method of this embodiment is used, a semiconductor device with a high degree of integration, which is conventionally difficult to manufacture, can be manufactured.

According to the present invention with the above-described arrangements, the following effects can be obtained.

A laminar flow of clean air is formed in the transfer path for a wafer such as a substrate to be processed up to the load-lock chamber to prevent dust from sticking to the substrate to be processed, thereby the required cleanliness in the entire clean room can be reduced, and the facility and maintenance cost can be largely reduced.

Use of a semiconductor manufacturing apparatus for processing a wafer by a processing apparatus in a predetermined atmosphere can contribute to cost reduction of a semiconductor device and the like.

As many apparently widely different embodiments of the present invention can be made without departing from the spirit and scope thereof, it is to be understood that the invention is not limited to the specific embodiments thereof except as defined in the appended claims.

What is claimed is:

1. A substrate processing system, comprising:
   a first processing device which is covered by a process chamber and adapted to process a substrate with a first process in a first gas atmosphere within the process chamber;

a transfer device which is covered by a clean booth and is adapted to transfer a substrate in a second gas atmosphere within the clean booth, the transfer device being arranged to transfer one of a substrate which has been processed with a second process by a second processing device and a substrate which is to be processed with the second process by the second processing device;

a load-lock chamber having a substrate transfer path between the first processing device and the transfer device; and a gas supply device which supplies the first gas from the process chamber to the load-lock chamber when the substrate is transferred between the load-lock chamber and the first processing device, and supplies the second gas from the clean booth to the load-lock chamber when the substrate is transferred between the load-lock chamber and the transfer device.

2. The system according to claim 1, further comprising:

an exhaust device which exhausts the load-lock chamber; and a gas circulator which circulates the first gas to the process chamber when the first gas supplied from the process chamber to the load-lock chamber is exhausted, and circulates the second gas to the clean booth when the second gas supplied from the clean booth to the load-lock chamber is exhausted.

3. An exposure processing system, comprising:

an exposure device which is covered by a process chamber and adapted to expose a substrate in a first gas atmosphere within the process chamber;

a transfer device which is covered by a clean booth and is adapted to transfer a substrate in a second gas atmosphere within the clean booth, the transfer device being arranged to transfer one of a substrate coated with a photosensitive agent by a coater and a substrate to be developed by a developer;

a load-lock chamber having a substrate transfer path between the exposure device and the transfer device; and a gas supply device which supplies the first gas from the process chamber to the load-lock chamber when the substrate is transferred between the load-lock chamber and the exposure device, and supplies the second gas from the clean booth to the load-lock chamber when the substrate is transferred between the load-lock chamber and the transfer device.

4. A device manufacturing method, comprising:

exposing a substrate using the exposure processing system comprising an exposure device which is covered by a process chamber and adapted to expose a substrate in a first gas atmosphere within the process chamber;

a transfer device which is covered by a clean booth and is adapted to transfer a substrate in a second gas atmosphere within the clean booth, the transfer device being arranged to transfer one of a substrate coated with a photosensitive agent by a coater and a substrate to be developed by a developer;

a load-lock chamber having a substrate transfer path between the exposure device and the transfer device; and a gas supply device which supplies the first gas from the process chamber to the load-lock chamber when the substrate is transferred between the load-lock chamber and the exposure device, and supplies the second gas from the clean booth to the load-lock chamber when the substrate is transferred between the load-lock chamber and the transfer device; and developing the exposed substrate using a developer.

5. A substrate processing system, comprising:

a first processing device which is covered by a process chamber and adapted to process a substrate with a first process in a first gas atmosphere within the process chamber;

a transfer device which is covered by a clean booth and adapted to transfer a substrate in a second gas atmosphere within the clean booth, the transfer device being arranged to transfer one of a substrate which has been processed with a second process by a second processing device and a substrate which is to be processed with the second process by the second processing device;

a load-lock chamber having a substrate transfer path between the first processing device and the transfer device; and a gas supply device having a valve arranged to switch gas supply paths, the gas supply device supplying the first gas to the load-lock chamber through a first gas supply path when the substrate is transferred between the load-lock chamber and the first processing device, and supplying a dry gas from a dry gas supply source to the load-lock chamber through a dry gas supply path when the substrate is transferred between the load-lock chamber and the transfer device.

6. The system according to claim 5, further comprising:

an exhaust device which exhausts the load-lock chamber; and a gas circulator which circulates the first gas to the process chamber when the first gas supplied through a gas supply path arranged from the process chamber to the load-lock chamber is exhausted.

7. An exposure processing system, comprising:

an exposure device which is covered by a process chamber and adapted to expose a substrate in a first gas atmosphere within the process chamber;

a transfer device which is covered by a clean booth and adapted to transfer a substrate in a second gas atmosphere within the clean booth, the transfer device being arranged to transfer one of a substrate coated with a photosensitive agent by a coater and a substrate to be developed by a developer;

a load-lock chamber having a substrate transfer path between the exposure device and the transfer device; and a gas supply device having a valve arranged to switch gas supply paths, the gas supply device supplying the first gas to the load-lock chamber through a first gas supply path when the substrate is transferred between the load-lock chamber and the exposure device, and supplying a dry gas from a dry gas supply source to the load-lock chamber through a dry gas supply path when the substrate is transferred between the load-lock chamber and the transfer device.

8. A device manufacturing method, comprising:

exposing a substrate using an exposure processing system comprising an exposure device which is covered by a process chamber and adapted to expose a substrate in a first gas atmosphere within the process chamber;

a transfer device which is covered by a clean booth and adapted to transfer a substrate in a second gas atmosphere within the clean booth, the transfer device being arranged to transfer one of a substrate coated with a photosensitive agent by a coater and a substrate to be developed by a developer;

a load-lock chamber having a substrate transfer path between the exposure device and the transfer device; and a gas supply device having a valve arranged to switch gas supply paths, the gas supply device supplying the first gas to the load-lock chamber through a first gas supply path when the substrate is transferred between the load-lock chamber and the exposure device, and supplying a dry gas from a dry gas supply source to the load-lock chamber through a dry gas supply path when the substrate is transferred between the load-lock chamber and the transfer device; and developing the exposed substrate using a developer.

9. A substrate processing system, comprising:

a first processing device which is covered by a process chamber and adapted to process a substrate with a first process in a first gas atmosphere within the process chamber;

a transfer device which is covered by a clean booth and is adapted to transfer a substrate in a second gas atmosphere within the clean booth, the transfer device being arranged to transfer one of a substrate which has been processed with a second process by a second processing device and a substrate which is to be processed with the second process by the second processing device;

a load-lock chamber having a substrate transfer path between the first processing device and the transfer device, the load-lock chamber comprising a first gate valve through which a substrate is transferred between the process chamber and the load-lock chamber and a second gate valve through which a substrate is transferred between the clean booth and the load-lock chamber; and a gas supply mechanism which supplies the first gas and the second gas to the load-lock chamber, wherein the gas supply mechanism is arranged to supply the second gas to the load-lock chamber when the first gate valve is closed and the second gate valve is opened during the substrate being transferred between the load-lock chamber and the transfer device.

10. An exposure processing system, comprising:

an exposure device which is covered by a process chamber and is adapted to expose a substrate in a first gas atmosphere within the process chamber;

a transfer device which is covered by a clean booth and is adapted to transfer a substrate in a second gas atmosphere within the clean booth, the transfer device being arranged to transfer one of a substrate coated with a photosensitive agent by a coater and a substrate to be developed by a developer;

a load-lock chamber having a substrate transfer path between the exposure device and the transfer device, the load-lock chamber comprising a first gate valve through which a substrate is transferred between the process chamber and the load-lock chamber and a second gate valve through which a substrate is transferred between the clean booth and the load-lock chamber; and a gas supply mechanism which supplies the first gas and the second gas to the load-lock chamber, wherein the gas supply mechanism is arranged to supply the second gas to the load-lock chamber when the first gate valve is closed and the second gate valve is opened during the substrate being transferred between the load-lock chamber and the transfer device.

11. A device manufacturing method, comprising:

exposing a substrate using an exposure processing system comprising an exposure device which is covered by a process chamber and is adapted to expose a substrate in a first gas atmosphere within the process chamber;

a transfer device which is covered by a clean booth and is adapted to transfer a substrate in a second gas atmosphere within the clean booth, the transfer device being arranged to transfer one of a substrate coated with a photosensitive agent by a coater and a substrate to be developed by a developer;

a load-lock chamber having a substrate transfer path between the exposure device and the transfer device, the load-lock chamber comprising a first gate valve through which a substrate is transferred between the process chamber and the load-lock chamber and a second gate valve through which a substrate is transferred between the clean booth and the load-lock chamber; and a gas supply mechanism which supplies the first gas and the second gas to the load-lock chamber;

wherein the gas supply mechanism is arranged to supply the second gas to the load-lock chamber when the first gate valve is closed and the second gate valve is opened during the substrate being transferred between the load-lock chamber and the transfer device; and developing the exposed substrate using a developer.

12. A substrate processing system, comprising:

a first processing device which is covered by a process chamber and adapted to process a substrate with a first process in a first gas atmosphere within the process chamber;

a transfer device which is covered by a clean booth and is adapted to transfer a substrate in a second gas atmosphere within the clean booth, the transfer device being arranged to transfer one of a substrate which has been processed with a second process by a second processing device and a substrate which is to be processed with the second process by the second processing device;

a load-lock chamber having a substrate transfer path between the first processing device and the transfer device; and a gas supply device which supplies the first gas and the second gas to the load-lock chamber, wherein the load-lock chamber including a straightening plate provided at an entire upper portion of an interior space within the load-lock chamber to make the first gas and the second gas supplied through the gas supply device uniform flows.

13. An exposure processing system, comprising:

an exposure device which is covered by a process chamber and is adapted to expose a substrate in a first gas atmosphere within the process chamber;

a transfer device which is covered by a clean booth and is adapted to transfer a substrate in a second gas atmosphere within the clean booth, the transfer device being arranged to transfer a substrate coated with a photosensitive agent by a coater or a substrate to be developed by a developer;

a load-lock chamber having a substrate transfer path between the exposure device and the transfer device; and a gas supply device which supplies the first gas to the load-lock chamber, wherein the load-lock chamber comprises a straightening plate provided at an entire upper portion of an interior space within the load-lock chamber to make the first gas and the second gas supplied through the gas supply device uniform flows.

14. A device manufacturing method, comprising:

exposing a substrate using the exposure processing system comprising
- an exposure device which is covered by a process chamber and is adapted to expose a substrate in a first gas atmosphere within the process chamber;
- a transfer device which is covered by a clean booth and is adapted to transfer a substrate in a second gas atmosphere within the clean booth, the transfer device being arranged to transfer a substrate coated with a photosensitive agent by a coater or a substrate to be developed by a developer;
- a load-lock chamber having a substrate transfer path between the exposure device and the transfer device; and
- a gas supply device which supplies the first gas to the load-lock chamber,
- wherein the load-lock chamber comprises a straightening plate provided at an entire upper portion of an interior space within the load-lock chamber to make the first gas and the second gas supplied through the gas supply device uniform flows; and developing the exposed substrate using a developer.

* * * * *

UNITED STATES PATENT AND TRADEMARK OFFICE
CERTIFICATE OF CORRECTION

PATENT NO. : 6,750,946 B2
DATED : June 15, 2004
INVENTOR(S) : Yutaka Tanaka et al.

It is certified that error appears in the above-identified patent and that said Letters Patent is hereby corrected as shown below:

<u>Column 4,</u>
Line 4, "load-jock" should read -- load-lock --.

<u>Column 11,</u>
Line 49, "the exposure" should read -- an exposure --.
Line 50, "comprising" should read -- comprising: --.

<u>Column 12,</u>
Line 61, "comprising" should read -- comprising: --.

<u>Column 14,</u>
Line 6, "comprising" should read -- comprising: --.

<u>Column 15,</u>
Line 9, "the exposure" should read -- an exposure --.
Line 10, "comprising" should read -- comprising: --.

Signed and Sealed this

Fourteenth Day of December, 2004

JON W. DUDAS
*Director of the United States Patent and Trademark Office*